US006570421B1

(12) United States Patent
Gauthier et al.

(10) Patent No.: US 6,570,421 B1
(45) Date of Patent: May 27, 2003

(54) PROGRAMMABLE LEAKAGE CURRENT OFFSET FOR PHASE LOCKED LOOP

(75) Inventors: Claude R. Gauthier, Fremont, CA (US); Pradeep R. Trivedi, Sunnyvale, CA (US); Brian W. Amick, Austin, TX (US)

(73) Assignee: Sun Microsystems, Inc., Santa Clara, CA (US)

( * ) Notice: Subject to any disclaimer, the term of this patent is extended or adjusted under 35 U.S.C. 154(b) by 0 days.

(21) Appl. No.: 10/230,862

(22) Filed: Aug. 29, 2002

(51) Int. Cl.[7] ................................................ H03L 7/06
(52) U.S. Cl. ...................................... 327/156; 327/157
(58) Field of Search ................................ 327/156–159; 375/376

(56) References Cited

U.S. PATENT DOCUMENTS 6,147,530 A * 11/2000 Nogawa ..................... 327/156
6,420,914 B1 * 7/2002 Hasegawa ................... 327/112
6,424,191 B1 * 7/2002 Nayebi et al. ............... 327/156
6,473,485 B1 * 10/2002 Fernandez-Texon ......... 377/27

* cited by examiner

Primary Examiner—Kenneth B. Wells
(74) Attorney, Agent, or Firm—Rosenthal & Osha L.L.P.

(57) ABSTRACT

A method and apparatus for post-fabrication adjustment of a phase locked loop leakage current is provided. The adjustment system includes an adjustment circuit that adjusts a leakage current offset circuit to compensate for the leakage current of a capacitor in the phase locked loop. The capacitor connects to a control voltage of the phase locked loop. Such control of the leakage current in the phase locked loop allows a designer to achieve a desired phase locked loop operating characteristic after the phase locked loop has been fabricated.

25 Claims, 7 Drawing Sheets

PROGRAMMABLE LEAKAGE CURRENT OFFSET FOR PHASE LOCKED LOOP

BACKGROUND OF INVENTION

As shown in FIG. 1, a typical computer system (10) has, among other components, a microprocessor (12), one or more forms of memory (14), integrated circuits (16) having specific functionalities, and peripheral computer resources (not shown), e.g., monitor, keyboard, software programs, etc. These components communicate with one another via communication paths (19), e.g., wires, buses, etc., to accomplish the various tasks of the computer system (10).

In order to properly accomplish such tasks, the computer system (10) relies on the basis of time to coordinate its various operations. To that end, a crystal oscillator (18) generates a system clock signal (referred to and known in the art as "reference clock" and shown in FIG. 1 as SYS_CLK) to various parts of the computer system (10). Modern microprocessors and other integrated circuits, however, are typically capable of operating at frequencies significantly higher than the system clock signal, and thus, it becomes important to ensure that operations involving the microprocessor (12) and the other components of the computer system (10) use a proper and accurate reference of time.

One component used within the computer system (10) to ensure a proper reference of time among the system clock signal and a microprocessor clock signal, i.e., "chip clock signal" or CHIP_CLK, is a type of clock generator known as a phase locked loop (PLL) (20). The PLL (20) is an electronic circuit that controls an oscillator such that the oscillator maintains a constant phase relative to the system clock signal. Referring to FIG. 1, the PLL (20) has as its input the system clock signal, which is its reference signal, and outputs a chip clock signal (shown in FIG. 1 as CHIP_CLK) to the microprocessor (12). The system clock signal and chip clock signal have a specific phase and frequency relationship controlled by the PLL (20). This relationship between the phases and frequencies of the system clock signal and chip clock signal ensures that the various components within the microprocessor (12) use a controlled and accounted for reference of time. When this relationship is not maintained by the PLL (20), however, the operations within the computer system (10) become non-deterministic.

FIG. 2 shows a block diagram of a typical PLL (200). The PLL (200) includes a PLL core (250), buffers (212, 214, 216, 218), and a feedback loop signal (221) on a feedback loop path. The buffers (212, 214) increase the drive strength of an output clock signal (215) to supply other circuits of the microprocessor (12 in FIG. 1) with a chip clock signal (217). The buffers (216, 218) buffer the chip clock signal (217) to additional circuits of the microprocessor (12 in FIG. 1). The time delay created by the buffers (212, 214, 216, 218) is accounted for in the feedback signal (221) that is supplied to the PLL core (250).

The PLL core (250) is designed to output the chip clock signal (217), which is a multiple of the system clock signal (201). When the PLL is in "lock," the chip clock signal (217) and system clock signal (201) maintain a specific phase relationship. To allow different multiplication ratios, the PLL core (250) may use several "divide by" circuits. A "divide by" circuit reduces the frequency of the input to the "divide by" circuit at its output by a specified factor. For example, the PLL core (250) uses a divide by A circuit (220) with the system clock signal (201), a divide by C circuit (222) with a voltage-controlled oscillator (210) output signal (213), and a divide by B circuit (224) with the feedback loop signal (221).

A phase-frequency detector (202) aligns the transition edge and frequency of a clock A signal (221) and a clock B signal (223). The phase-frequency detector (202) adjusts its output frequency in order to zero any phase and frequency difference between the clock A signal (221) and the clock B signal (223). The phase-frequency detector (202) produces signals that control charge pumps (204, 234). The phase-frequency detector (202) controls the charge pumps (204, 234) to increase or decrease their output using control signals up (203) and down (205). The charge pump (204) adds or removes charge from a capacitor $C_1$ (206) that changes the voltage potential at the input of a bias-generator (208). The capacitor (206) is connected between a power supply $V_{DD}$ and a voltage potential on a control signal $V_{CTRL}$ (207). The charge pump (234) adds or removes charge from a bias voltage $V_{BP}$ (209) of a bias-generator (208).

The bias-generator (208) produces bias voltages $V_{BP}$ (209) and $V_{BN}$ (211) in response to the voltage potential on the control signal (207). The PLL core (250) may be self-biased by adding the charge pump (234) to the bias-generator (208) bias voltage $V_{BP}$ (209). The addition of a second charge pump (234) allows the removal of a resistor in series with the capacitor (206). A voltage-controlled oscillator (210) produces an output signal (213) that has a frequency related to the bias voltages $V_{BP}$ (209) and $V_{BN}$ (211).

The "divide by" circuits (220, 222, 224) determine the frequency multiplication factor provided by the PLL core (250). The addition of "divide by" circuits (220, 222, 224) enables the PLL core (250) to multiply the system clock signal (201). Multiplying the system clock signal (201) is useful when the chip clock signal (217) must have a higher frequency than the system clock signal (201).

For example, during normal operation, the variables A and C may both be set to one in the divide by A circuit (220) and divide by C circuit (222), respectively. The variable B may be set to 10 in the divide by B circuit (224). The phase-frequency detector (202) aligns the transition edge and frequency of the clock A signal (221) and the clock B signal (223). The phase-frequency detector (202) adjusts PLL core (250) output clock signal (215) frequency in order to zero any phase and frequency difference between the clock A signal (221) and the clock B signal (223). Because the clock B signal (223) has a divide by B circuit (224) that reduces its input frequency by 10, the phase-frequency detector (202) adjusts the voltage-controlled oscillator (210) output signal (213) to a frequency 10 times greater than the clock A signal (221). Accordingly, the chip clock signal (217) is 10 times higher in frequency than the system clock signal (201).

The power consumption of a microprocessor is of concern. Reducing the frequency of the chip clock signal (217) reduces the switching rate of other circuits in the microprocessor (12 in FIG. 1). A low power mode may be entered when there is no activity in the microprocessor for an extended period of time. A slower switching rate typically reduces the power consumption of a microprocessor (12 in FIG. 1).

A change in the frequency of the chip clock signal (217) is accomplished by changing the ratio in the divide by circuits (220, 222, 224). For example, during reduced power operation, the variable A may be set to 16 in the divide by A circuit (220); the variable B may be set to 5 in the divide by B circuit (224); and the variable C may be set to 32 in the divide by C circuit (222). In this example, the frequency of the chip clock signal (217) is 5/16 times the system clock signal (201). Also, the phase-frequency detector (202) updates 16 times less frequently compared to the non-reduced power example above.

Proper operation of the microprocessor (12 shown in FIG. 1) depends on the PLL (200) maintaining a constant phase and frequency relationship between the system clock signal (201) and the chip clock signal (217).

SUMMARY OF INVENTION

According to one aspect of the present invention, an integrated circuit comprises a clock path arranged to carry a clock signal; a power supply path arranged to receive power from a power supply; a phase locked loop operatively connected to the power supply path and the clock path where the phase locked loop comprises a capacitor arranged to store a voltage potential dependent on a phase and frequency difference between the clock signal and an output clock signal generated by the phase locked loop; a leakage current offset circuit operatively connected to the capacitor where the leakage current offset circuit is arranged to adjust the voltage potential; an adjustment circuit operatively connected to the leakage current offset circuit where the adjustment circuit is arranged to control the leakage current offset circuit; and a test processor unit operatively connected to the adjustment circuit where the test processor unit is arranged to selectively adjust the adjustment circuit.

According to one aspect of the present invention, a method for post-fabrication treatment of a phase locked loop comprises generating an output clock signal from the phase locked loop; comparing the output clock signal to an input clock signal; storing a voltage potential on a capacitor dependent on the comparing; generating a binary control word using a test processor unit; selectively adjusting an adjustment circuit responsive to the binary control word; and compensating a leakage current of the capacitor dependent on the selectively adjusting.

According to one aspect of the present invention, an integrated circuit comprises means for generating an output clock signal; means for comparing the output clock signal to an input clock signal; means for storing a voltage potential dependent on the means for comparing; means for generating a binary control word; and means for adjusting the voltage potential dependent on the binary control word.

Other aspects and advantages of the invention will be apparent from the following description and the appended claims.

DETAILED DESCRIPTION

Figure 1:
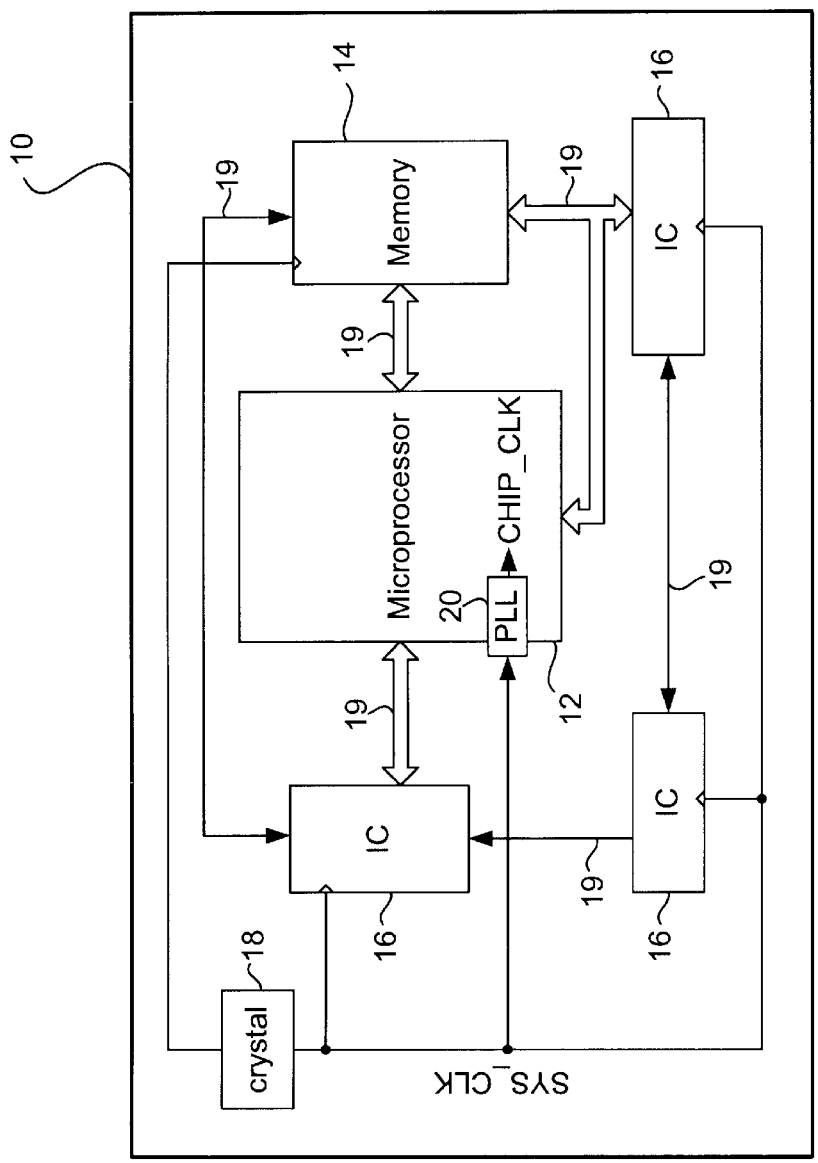
FIG. 1 shows a typical computer system component.

Exemplary embodiments of the invention will be described with reference to the accompanying drawings. Like items in the drawings are shown with the same reference numbers.

Figure 2:
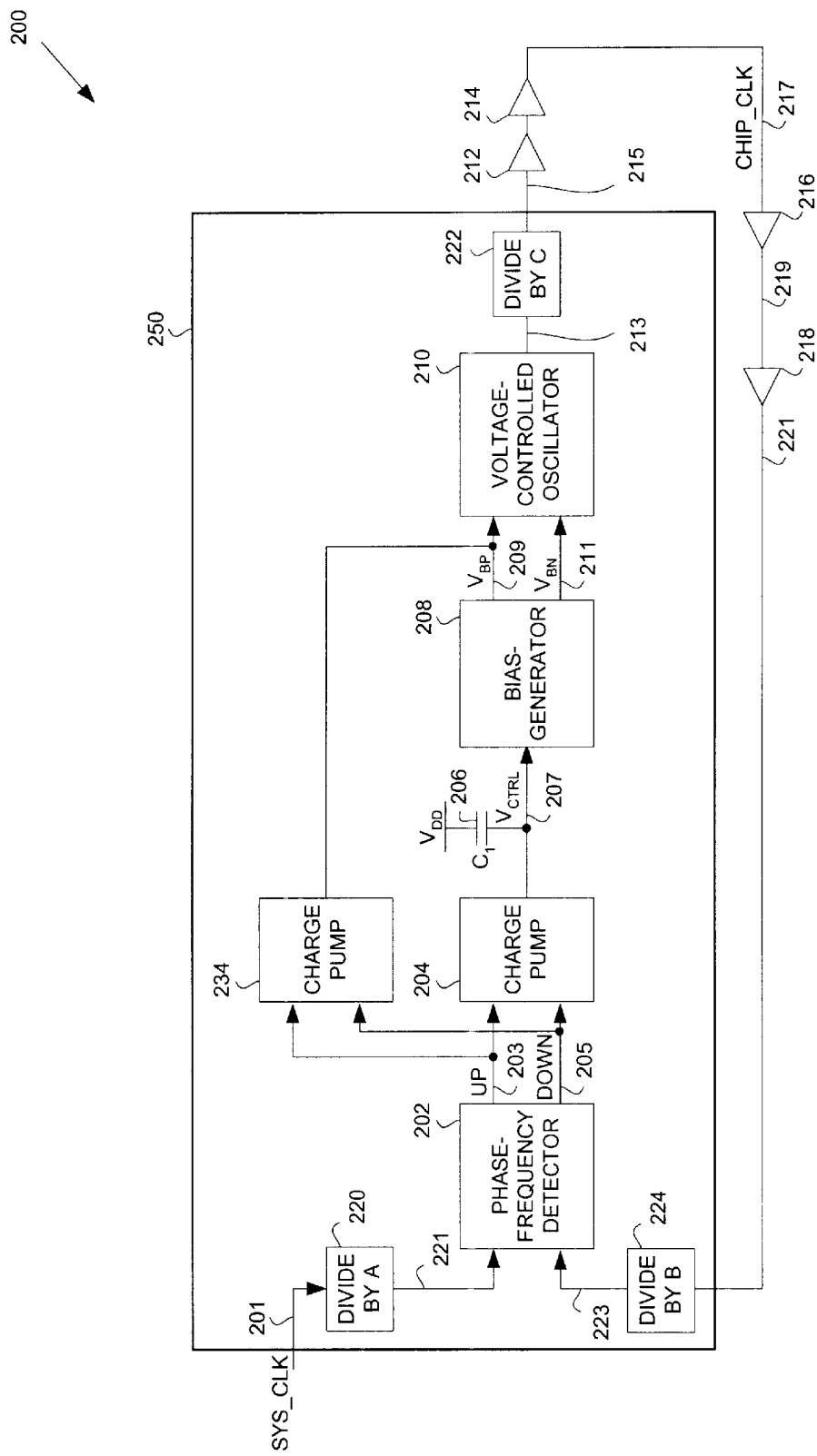
FIG. 2 shows a block diagram of a prior art phase locked loop.

The present invention relates to an adjustment system for post-fabrication adjustment of a PLL (200 shown in FIG. 2). In FIG. 2, the PLL (200) determines the output frequency of the voltage-controlled oscillator (210) dependent on a voltage potential maintained by the capacitor (206). Charge may leak from the capacitor (206) due leakage current, which, in turn, changes the stored voltage potential on the capacitor (206). Accordingly, the output frequency of the voltage-controlled oscillator (210) may drift. The adjustment system includes an adjustment circuit that can compensate for the leakage current. Thus, the leakage current of the capacitor (206) may be offset such that the capacitor (206) maintains a constant voltage potential. Embodiments of the present invention involve a method for modifying an operating characteristic of a phase locked loop after the phase locked loop has been manufactured.

Figure 3:
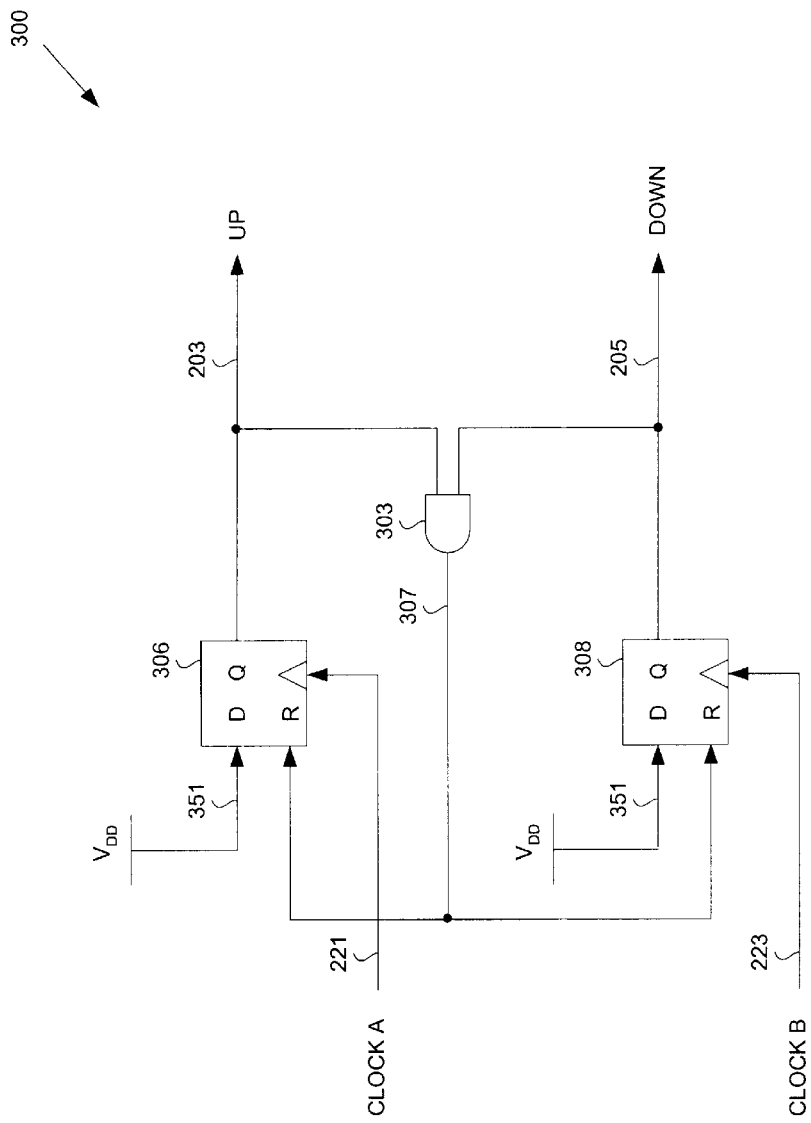
FIG. 3 shows a schematic diagram of a prior art phase-frequency detector.

FIG. 3 shows a block diagram of a typical phase-frequency detector (300). The phase-frequency detector (300) is representative of the generic phase-frequency detector (202) shown in FIG. 2. The phase-frequency detector (300) integrates the phase error that results between the clock A signal (221) and the clock B signal (223). The clock A signal (211) clocks a flip-flop (306) and the clock B signal (223) clocks a flip-flop (308).

When the clock A signal (221) transitions from a low state to a high state, the flip-flop (306) transfers the high state created by the power supply $V_{DD}$ (351) at an input of the flip-flop (306) to the up signal (203). When the clock B signal (223) transitions from a low state to a high state, flip-flop (308) transfers the high state created by the power supply $V_{DD}$ (351) at an input of the flip-flop (308) to the down signal (205). When both the up and down signals (203, 205) are at a high state, the AND gate (303) outputs a high state on signal line (307). The high state on signal line (307) resets both flip-flop (306) and flip-flop (308). The up and down signals (203, 205) transition to a low state when the flip-flop (306) and flip-flop (308) are reset, respectively.

Figure 4:
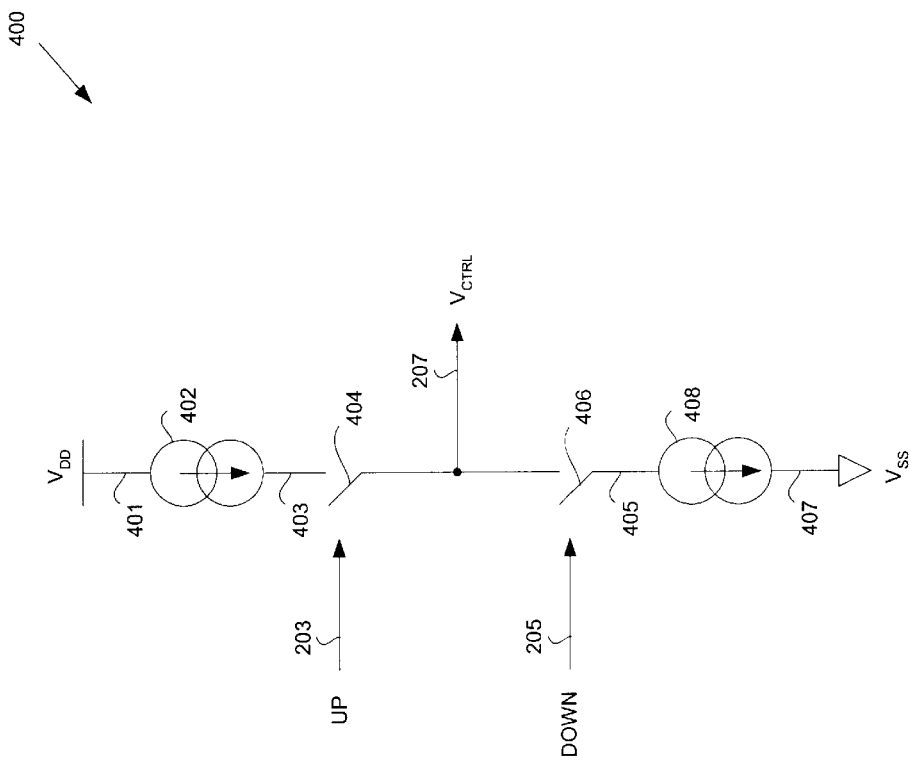
FIG. 4 shows a schematic diagram of a prior art charge pump.

FIG. 4 shows a block diagram of a typical charge pump (400). The charge pump (400) is representative of the generic charge pumps (204, 234) shown in FIG. 2. The charge pump (400) has two current sources (402, 408). The current source (402) is connected between the power supply $V_{DD}$ (401) and the signal line (403). The current source (408) is connected between the power supply $V_{SS}$ (407) and the signal line (405).

In FIG. 4, the up and down signals (203, 205) from the phase-frequency detector (300 shown in FIG. 3) determine whether switches (404, 406) are closed, respectively. When the up signal (203) is at a high state, the switch (404) is closed. The switch (404) is connected between signal (403) and the control signal (207). When closed, the switch (404) allows the current generated by the current source (402) to add charge to the capacitor (206 shown in FIG. 2) using the voltage potential on the control signal (207).

When the down signal (205) is at a high state, the switch (406) is closed. The switch (406) is connected between signal (405) and the control signal (207). When closed, the switch (406) allows the current generated by the current source (408) to remove charge from the capacitor (206 shown in FIG. 2) using the voltage potential on the control signal (207).

A short time period exists when both the up and down signals (203, 205) are at a high state. In FIG. 3, when both the up and down signals (203, 205) transition to a high state, the AND gate (303) resets the flip-flops (306, 308) by generating a high state on the signal line (307). A finite time duration is needed for the AND gate (303) and the flip-flops (306, 308) to respond to this change in state. In FIG. 4, both the switches (404, 406) are closed when both the up and down signals (203, 205) signals are high. During this time, a nominal amount of charge is added to the capacitor (206 shown in FIG. 2). In this case, some or all of the current generated by the current source (402) is transferred to the $V_{SS}$ power supply (407) through the current source (408).

Figure 5:
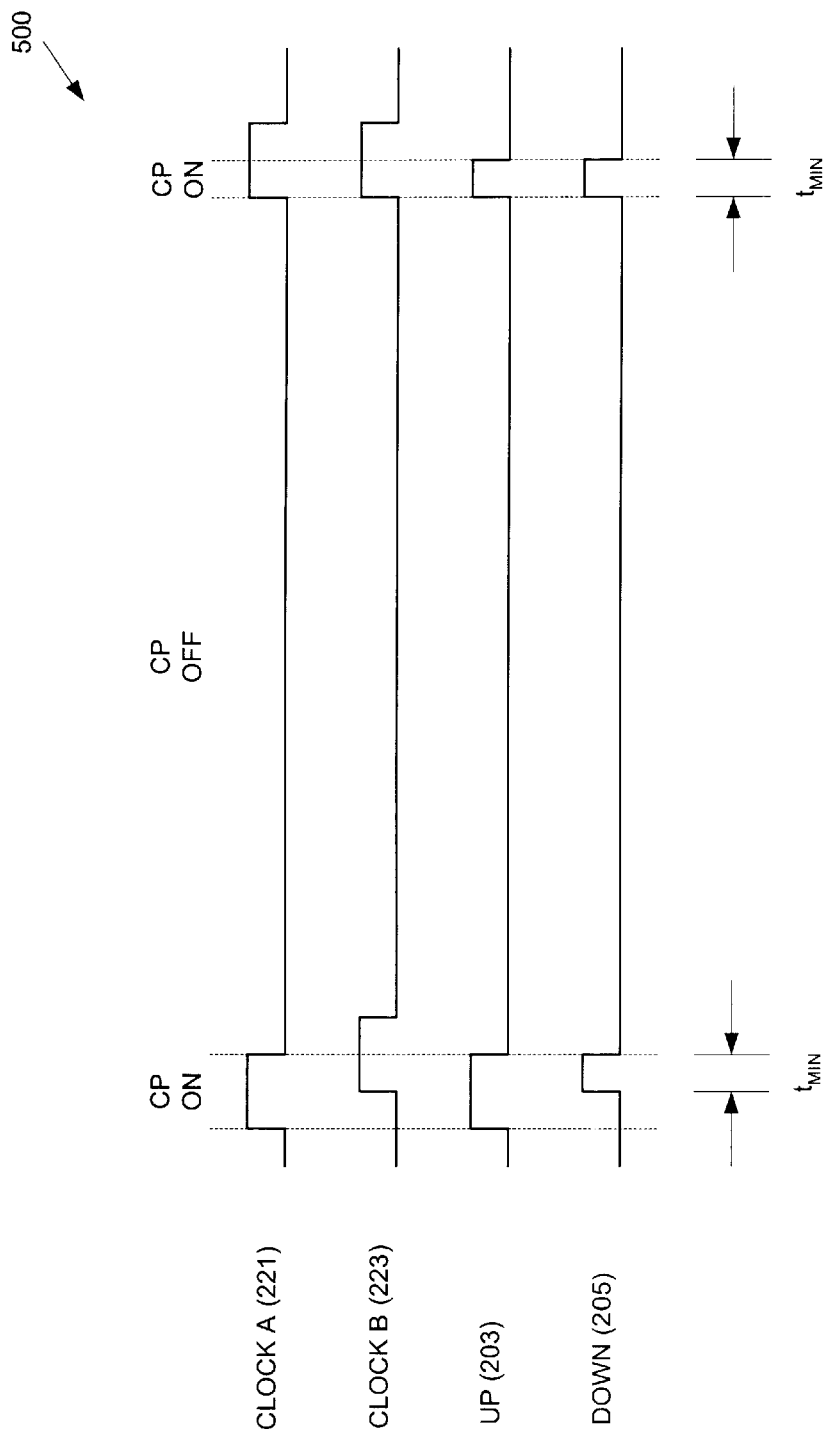
FIG. 5 shows a timing diagram for the phase-frequency detector shown in FIG. 3.

FIG. 5 shows a timing diagram (500) for the phase-frequency detector (300) shown in FIG. 3. The timing diagram (500) shows two clock cycles. The first clock cycle shows the clock B signal (223) lagging the clock A signal (221) (i.e., they are out of phase). The second cycle shows the clock B signal (223) properly aligned with the clock A signal (221).

In the first cycle, when the clock A signal (221) transitions from a low state to a high state, the up signal (203) transitions from a low state to a high state. When the clock B signal (223) transitions from a low state to a high state, the down signal (205) transitions from a low state to a high state. Because both the up and down signals (203, 205) are at a high state, the AND gate (303 shown in FIG. 3) resets both flip-flops (306, 308 shown in FIG. 3). The up and down signals (203, 205) output a low state when the flip-flops (306, 308 shown in FIG. 3) are reset, respectively.

In the first cycle, the up signal (203) is at a high state for a longer duration than the down signal (205). Accordingly, the current source (402 shown in FIG. 4) adds charge to the capacitor (206 shown in FIG. 2). If the down signal (205) was at a high state for a longer duration than the up signal (203), the current source (408 shown in FIG. 4) would remove charge from the capacitor (206 shown in FIG. 2). The change in the voltage potential maintained by the capacitor (206 shown in FIG. 2) affects the frequency of the voltage-controlled oscillator (210 shown in FIG. 2).

In FIG. 5, in the second cycle, both the clock A signal (221) and the clock B signal (223) transition from a low state to a high state at the same time. In other words, the clock A signal (221) and the clock B signal (223) are in phase, and the PLL is said to be in "lock." Accordingly, both the up and down signals (203, 205) transition from a low state to a high state at the same time. Also, both the flip-flops (306 and 308 shown in FIG. 3) are reset simultaneously. Because a finite time duration (i.e., $t_{MIN}$) is needed for the AND gate (303 shown in FIG. 3) and the flip-flops (306 and 308 shown in FIG. 3) to respond to the change in state, both the up and down signals (203, 205) have a finite time duration for which they are high. During the time both the up and down signals (203, 205) are low, the voltage potential on the control signal (207 shown in FIG. 2) may have drifted toward the power supply, $V_{DD}$, due to the leakage current through the capacitor (206 shown in FIG. 2). A nominal amount of charge is added to the capacitor (206 shown in FIG. 2) to maintain the present voltage potential on the control signal (207 shown in FIG. 2).

In FIG. 5, the times during which the charge pump (400 shown in FIG. 4) may modify or maintain the charge on the capacitor (206 shown in FIG. 2) are indicated. When the clock A signal (221) and the clock B signal (223) are aligned, the time duration that the charge pump (400 shown in FIG. 4) is active is relatively small (i.e., $t_{MIN}$).

During the time the charge pump (400 shown in FIG. 4) is inactive (i.e., when both switches (404, 406) are open), the voltage potential on the capacitor (206 shown in FIG. 2) may drift due to leakage currents inherent with devices used to form the capacitor (206 shown in FIG. 2). Semiconductor capacitors are typically parallel plate capacitors formed by connecting the source and drain of a transistor together to create one terminal of the capacitor. The other terminal of the capacitor is formed by the gate connection of the transistor. Tunneling through the gate creates a path for leakage current. Leakage current causes the voltage potential originally stored on the capacitor to change. In a PLL, the capacitor (e.g., 206 shown in FIG. 2) helps maintain the amount of frequency produced by the voltage-controlled oscillator (210 shown in FIG. 2).

In FIG. 2, the relatively long time durations between the charge pump (204) updating the charge stored (i.e., voltage potential stored) on the capacitor (206) may result in a drift in the expected amount of delay of the PLL (200). Although a designer may intend for an integrated circuit to have a particular value for the leakage current of the capacitor (206), actual values for these parameters are typically unknown until the integrated circuit has been fabricated (i.e., in a post-fabrication stage).

For example, a designer may intend for the delay drift of the PLL (200) to be within in a particular range. The leakage current of the capacitor (206) may be unintentionally affected by many factors in the fabrication process. Because the leakage current cannot be redesigned in the post-fabrication stage without considerable temporal and monetary expenditures, these fabrication factors may cause the PLL (200) to have a different delay drift range than the range the PLL (200) was designed to have and, therefore, the PLL (200) may have poor performance. Accordingly, there is a need for a technique and design that facilitates increased post-fabrication control of leakage current in the capacitor (206) of the PLL (200).

Figure 6:
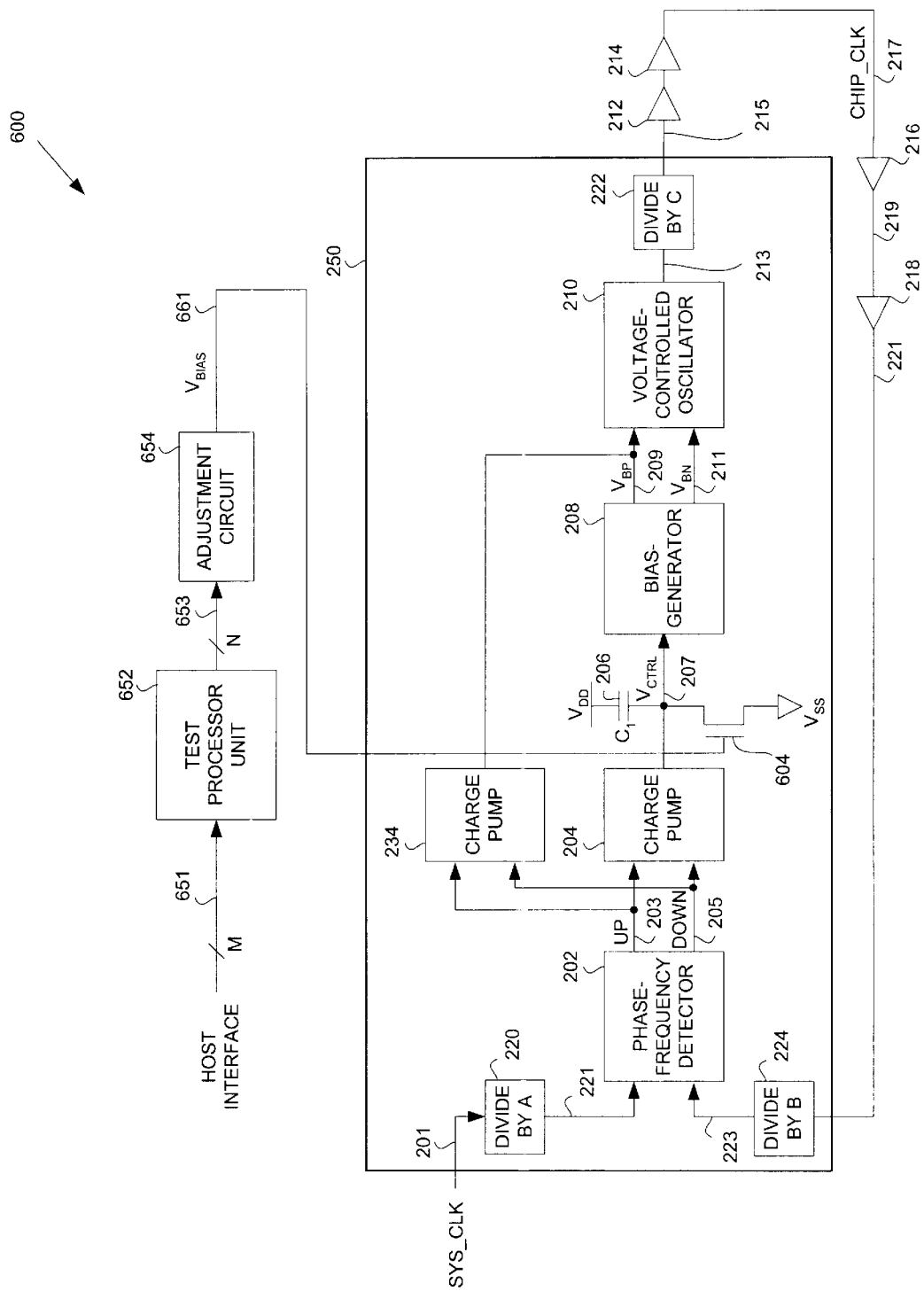
FIG. 6 shows a block diagram of a phase locked loop with an adjustable leakage current offset circuit in accordance with an embodiment of the present invention.

FIG. 6 shows an exemplary adjustable PLL (600) in accordance with an embodiment of the present invention. The phase-frequency detector (202), capacitor (206), bias-generator (208) and voltage-controlled oscillator (210) of the adjustable PLL (600) operate similar to those respective components described above with reference to FIG. 2.

In FIG. 6, a leakage current offset circuit (604) is connected between the control signal (207) and a power supply $V_{SS}$. As the capacitor (206) leaks current, the voltage potential on the control signal (207) has a tendency to drift toward the power supply $V_{DD}$. The leakage current offset circuit (604) is arranged to pull the voltage potential on the control signal (207) toward a power supply $V_{SS}$. For example, in FIG. 6, an n-channel transistor is used as the leakage current offset circuit (604).

One of ordinary skill in the art will understand that in other embodiments, the capacitor (206) may be connected between the control signal (207) and the power supply $V_{SS}$. In this case, the leakage current offset circuit (604) is connected between the control signal (207) and the power supply $V_{DD}$. A leakage current offset circuit (604) in this arrangement may be a p-channel transistor.

In FIG. 6, an adjustment circuit (654) is used to adjust the leakage current offset circuit (604) to compensate for the leakage current of the capacitor (206). A bias voltage potential, $V_{BIAS}$ (661), is used to control the amount of compensation applied to offset the leakage current. The bias voltage potential (661) may be adjusted to increase, decrease, turn off, or maintain the amount of leakage current compensation (i.e., leakage current offset) produced by the leakage current offset circuit (604).

In FIG. 6, a test processor unit (652) controls the adjustment circuit (654) using multiple adjustment signals N (653). The values of the multiple adjustment signals N (653) are determined by the test processor unit (652). The test processor unit (652) generates the multiple adjustment signals N (653), or binary control word, from registers that determine the settings of the adjustment circuit (654). The test processor unit (652) may change the contents of its registers through a host interface.

In one or more embodiments of the present invention, the test processor unit (652) may respond to instructions. The instructions may be interpreted by the test processor unit (652) and may result in a change to register contents stored in the test processor unit (652). A change to register contents may result in a change to the multiple adjustment signals N (653).

The test processor unit (652) may communicate through a host interface using M communication lines (651). Those of ordinary skill in the art will understand that the host interface and M communication lines (651) may take a wide variety of forms. In one or more embodiments, the host interface may be operatively connected to a separate computer system. Further, in one or more embodiments, the host interface may be defined by an industry standard.

As mentioned above, the host interface may be used to operatively connect to a separate computer system. For example, a tester (not shown) may communicate with the test processor unit (652). In some embodiments, the tester (not shown) may instruct the test processor unit (652) to adjust adjustment circuit (654) to modify the offset of a leakage current of the adjustable PLL (600). In some embodiments, the tester (not shown) may measure an operating characteristic of the adjustable PLL (600) or a representative operating characteristic of an integrated circuit on which the adjustable PLL (600) resides to determine the effect of the adjustment. A variety of different adjustments may be made in order to identify the adjustment settings that produce the desired operating characteristics of the adjustable PLL (600).

For example, the tester (not shown) may be used to adjust the adjustable PLL (600) until the delay drift in the voltage-controlled oscillator (210) is minimized. The tester (not shown) may also be used to adjust the adjustable PLL (600) until the operating characteristics of the adjustable PLL (600) reaches a desired performance level. Such operating characteristics may include delay drift, maximum operating frequency, minimum operating frequency, lock time, etc.

One of ordinary skill in the art will understand that even though the adjustment circuit (654) may be connected to the bias voltage potential (661) of the leakage current offset circuit (604), the adjustment circuit (654) may be turned "off." In other words, the adjustment circuit (654) may be controlled so as not to have an effect on the adjustable PLL (600).

Those skilled in the art will understand that the adjustable PLL (600) may be analog, digital, or a combination of both types of circuits.

Figure 7:
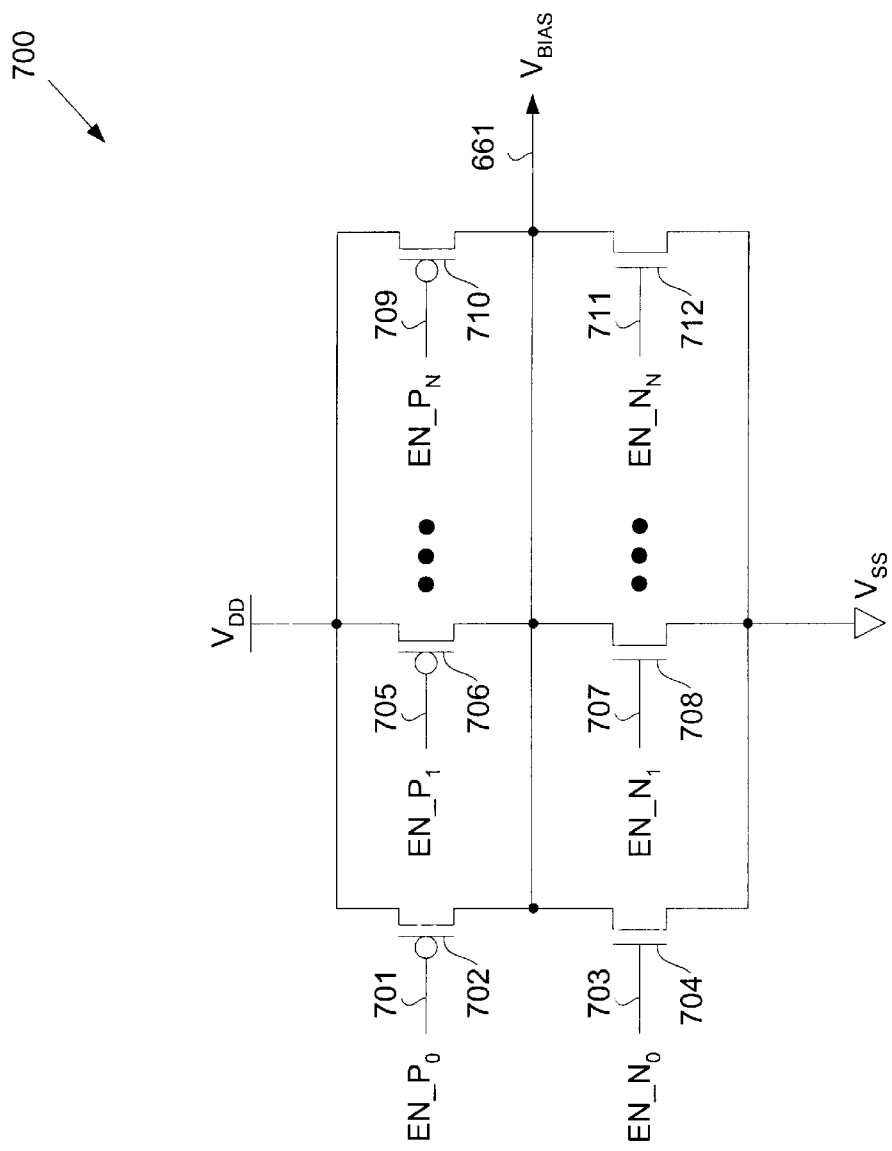
FIG. 7 shows a schematic diagram of an adjustment circuit in accordance with an embodiment of the present invention.

FIG. 7 shows an exemplary adjustment circuit (700) in accordance with an embodiment of the present invention. The adjustment circuit (700) includes multiple p-channel transistors (702, 706, 710) arranged in parallel with each other. The multiple p-channel transistors (702, 706, 710) connect between a power supply $V_{DD}$ and a common node on which a bias voltage potential (661) is supplied to the leakage current offset circuit (604 shown in FIG. 6). The adjustment circuit (700) also includes multiple n-channel transistors (704, 708, 712) arranged in parallel with each other. The multiple n-channel transistors (704, 708, 712) connect between power supply $V_{SS}$ and the bias voltage potential (661).

Each transistor has an individual control signal that turns "on" or "off" the respective p-channel transistors (702, 706, 710) and respective n-channel transistors (704, 708, 712). The p-channel transistors (702, 706, 710) have control signals EN_$P_0$ (701), EN_$P_1$ (705), and EN_$P_N$ (709) connected to their gates, respectively. The n-channel transistors (704, 708, 712) have control signals EN_$N_0$ (703), EN_$N_1$ (707), and EN_$N_N$ (711) connected to their gates, respectively. A "low" voltage potential on any of the EN_$P_x$ control signals (701, 705, 709), where "x" represents any index 0 through N, turns "on" the respective p-channel transistor (702, 706, 710). A "high" voltage potential on any of the EN_$N_x$ control signals (703, 707, 711), where "x" represents any index 0 through N, turns "on" the respective n-channel transistor (704, 708, 712).

A p-channel transistor (702, 706, 710) that is "on" changes the bias voltage potential (661) toward power supply $V_{DD}$. An n-channel transistor (704, 708, 712) that is "on" changes the bias voltage potential (661) toward power supply $V_{SS}$. By selecting which p-channel transistors (702, 706, 710) and/or n-channel transistors (704, 708, 712) are "on," a selected change in the bias voltage potential (661) may be achieved.

Those of ordinary skill in the art will understand that the p-channel transistors (702, 706, 710) and n-channel transistors (704, 708, 712) may be turned "on" individually or as a group. The p-channel transistors (702, 706, 710) and n-channel transistors (704, 708, 712) may be selected so that each transistor has a different effect compared to the other transistors. For example, a transistor's gate width may be varied to adjust the strength of each transistor. The gate widths of the p-channel transistors (702, 706, 710) and n-channel transistors (704, 708, 712) may be designed to provide a linear, exponential, or other function as more transistors are turned "on." In some embodiments, the p-channel transistors (702, 706, 710) and n-channel transistors (704, 708, 712) may be sized so that each transistor has a different resistance. For example, transistor gate lengths may be increased (i.e., long channel transistors) to increase the inherent resistance of each transistor. A larger inherent resistance may be advantageous if both a p-channel transistor and a n-channel transistor are "on" simultaneously. In one or more embodiments, the adjustment circuit (700) may include only one p-channel transistor (e.g., p-channel transistor (702)) and one n-channel transistor (e.g., n-channel transistor (704)) connected in series.

The adjustment circuit (700) in FIG. 7 may be used as the adjustment circuit (654) shown in FIG. 6. In FIG. 6, the test processor unit (652) generates a binary control word that determines which n-channel transistors (704, 708, 712 shown in FIG. 7) and p-channel transistors (702, 706, 710 shown in FIG. 7) are "on" and which are "off" in the adjustment circuit (654). Depending on the binary control word maintained by the test processor unit (652), multiple adjustment signals N (653) that represent EN_$N_x$ signals (703, 707, 711 in FIG. 7) and EN_$P_x$ signals (701, 705, 709 in FIG. 7) may turn "on" or turn "off" the p-channel transistors (702, 706, 710 shown in FIG. 7) and n-channel transistors (704, 708, 712 shown in FIG. 7) in the adjustment circuit (654). The bias voltage potential (661) of the adjustment circuit (654) adjusts the leakage current offset circuit (604).

Advantages of the present invention may include one or more of the following. In one or more embodiments, because the adjustment circuit (654 shown in FIG. 6) may modify the operating characteristics of the adjustable PLL 600 in FIG. 6), an investigation of the adjustable PLL's (600 in FIG. 6) response during operating conditions may be performed. Realistic results help determine appropriate values for circuit elements within the adjustable PLL (600 in FIG. 6) and help alleviate costly over design.

In one or more embodiments, because the adjustable PLL (600 in FIG. 6) may be fabricated with a means for adjusting the leakage current offset, fewer design iterations and higher confidence in the adjustable PLL (600 in FIG. 6) operating characteristics may be afforded.

In one or more embodiments, a tester (not shown) and test processor unit 652 shown in FIG. 6) may communicate so that performance characteristics may be analyzed, and/or adjustments made to the adjustable PLL (600 shown in FIG. 6).

In one or more embodiments, a limited number of adjustable PLLs (600 in FIG. 6) may need to be tested to determine the desired value for the binary word for a larger number of adjustable PLLs (600 in FIG. 6).

While the invention has been described with respect to a limited number of embodiments, those skilled in the art, having benefit of this disclosure, will appreciate that other embodiments can be devised which do not depart from the scope of the invention as disclosed herein. Accordingly, the scope of the invention should be limited only by the attached claims.

What is claimed is:

1. An integrated circuit, comprising:
    a clock path arranged to carry a clock signal;
    a power supply path arranged to receive power from a power supply;
    a phase locked loop operatively connected to the power supply path and the clock path, wherein the phase locked loop comprises a capacitor arranged to store a voltage potential dependent on a phase and frequency difference between the clock signal and an output clock signal generated by the phase locked loop;
    a leakage current offset circuit operatively connected to the capacitor, wherein the leakage current offset circuit is arranged to adjust the voltage potential;
    an adjustment circuit operatively connected to the leakage current offset circuit, wherein the adjustment circuit is arranged to control the leakage current offset circuit; and
    a test processor unit operatively connected to the adjustment circuit, wherein the test processor unit is arranged to selectively adjust the adjustment circuit.

2. The integrated circuit of claim 1, wherein the adjustment circuit comprises:
    a first switch arranged to control current flow between a first voltage potential and an output of the adjustment circuit; and
    a second switch arranged to control current flow between a second voltage potential and the output of the adjustment circuit, wherein the output is operatively connected to the leakage current offset circuit.

3. The integrated circuit of claim 1, wherein the adjustment circuit comprises a first p-channel transistor and a first n-channel transistor, wherein the first p-channel transistor and the first n-channel transistor are connected in series.

4. The integrated circuit of claim 3, the adjustment circuit further comprising:

a second p-channel transistor connected in parallel with the first p-channel transistor; and
a second n-channel transistor connected in parallel with the first n-channel transistor, wherein the first p-channel transistor and second p-channel transistor are in series with the first n-channel transistor and second n-channel transistor.

5. The integrated circuit of claim 4, wherein the first p-channel transistor is a longer channel transistor than the second p-channel transistor.

6. The integrated circuit of claim 4, wherein the first n-channel transistor is a longer channel transistor than the second n-channel transistor.

7. The integrated circuit of claim 4, wherein the first p-channel transistor is a wider gate width transistor than the second p-channel transistor.

8. The integrated circuit of claim 4, wherein the first n-channel transistor is a wider gate width transistor than the second n-channel transistor.

9. The integrated circuit of claim 1, wherein the leakage current offset circuit comprises a transistor, and wherein the adjustment circuit is operatively connected to a gate of the transistor.

10. The integrated circuit of claim 1, wherein the test processor unit is arranged to respond to an instruction.

11. The integrated circuit claim 1, wherein the test processor unit generates a binary control word.

12. The integrated circuit of claim 11, wherein the adjustment circuit is responsive to the binary control word.

13. A method for post-fabrication treatment of a phase locked loop, comprising:
    generating an output clock signal from the phase locked loop;
    comparing the output clock signal to an input clock signal;
    storing a voltage potential on a capacitor dependent on the comparing;
    generating a binary control word using a test processor unit;
    selectively adjusting an adjustment circuit responsive to the binary control word; and
    compensating a leakage current of the capacitor dependent on the selectively adjusting.

14. The method of claim 13, wherein compensating uses a leakage current offset circuit.

15. The method of claim 14, wherein the selectively adjusting uses the adjustment circuit to operatively control a gate of a transistor in the leakage current offset circuit.

16. The method of claim 13, wherein the selectively adjusting the adjustment circuit comprises:
    controlling a first current flow between a first voltage potential and an output of the adjustment circuit; and
    controlling a second current flow between a second voltage potential and the output of the adjustment circuit.

17. The method of claim 13, wherein the adjustment circuit comprises a first p-channel transistor and a first n-channel transistor connected in series.

18. The method of claim 17, the adjustment circuit further comprising:
    a second p-channel transistor connected in parallel with the first p-channel transistor; and
    a second n-channel transistor connected in parallel with the first n-channel transistor, wherein the first p-channel transistor and second p-channel transistor are in series with the first n-channel transistor and second n-channel transistor.

19. The method of claim 18, wherein the first p-channel transistor is a longer channel transistor than the second p-channel transistor.

20. The method of claim 18, wherein the first n-channel transistor is a longer channel transistor than the second n-channel transistor.

21. The method of claim 18, wherein the first p-channel transistor is a wider gate width transistor than the second p-channel transistor.

22. The method of claim 18, wherein the first n-channel transistor is a wider gate width transistor than the second n-channel transistor.

23. The method of claim 13, wherein the leakage current offset circuit comprises a transistor.

24. The method of claim 13, wherein the selectively adjusting comprises:

using the test processor unit to adjust the adjustment circuit to one of a fixed number of possible settings.

25. An integrated circuit, comprising:

means for generating an output clock signal;

means for comparing the output clock signal to an input clock signal;

means for storing a voltage potential dependent on the means for comparing;

means for generating a binary control word; and means for adjusting the voltage potential dependent on the binary control word.

* * * * *